US011307087B2

(12) United States Patent
Geiger

(10) Patent No.: US 11,307,087 B2
(45) Date of Patent: Apr. 19, 2022

(54) OPTOELECTRONIC MODULES WITH TEMPERATURE-INDEPENDENT CHARACTERISTICS

(71) Applicant: ams Sensors Singapore Pte. Ltd., Singapore (SG)

(72) Inventor: Jens Geiger, Thalwil (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 291 days.

(21) Appl. No.: 16/629,461

(22) PCT Filed: Jul. 11, 2018

(86) PCT No.: PCT/SG2018/050343
§ 371 (c)(1),
(2) Date: Jan. 8, 2020

(87) PCT Pub. No.: WO2019/013708
PCT Pub. Date: Jan. 17, 2019

(65) Prior Publication Data
US 2021/0364351 A1    Nov. 25, 2021

Related U.S. Application Data

(60) Provisional application No. 62/531,140, filed on Jul. 11, 2017.

(51) Int. Cl.
*G01J 1/44* (2006.01)
*G01S 17/04* (2020.01)
(Continued)

(52) U.S. Cl.
CPC ............. *G01J 1/44* (2013.01); *G01S 17/04* (2020.01); *H01L 31/12* (2013.01); *H01S 5/068* (2013.01);
(Continued)

(58) Field of Classification Search
CPC ........ G01J 1/44; G01J 2001/444; G01K 7/02; G01K 7/22; H01S 5/183; H01S 5/068; H04R 3/00; H01L 31/12; G01S 17/04
See application file for complete search history.

(56) References Cited

U.S. PATENT DOCUMENTS 6,687,280 B1    2/2004  Kajita
6,879,612 B1*   4/2005  Wasserbauer ........... H01S 5/305
                                                    372/50.1
(Continued)

FOREIGN PATENT DOCUMENTS

CN       103630276 A      3/2014

OTHER PUBLICATIONS

International Preliminary Report on Patentability for Application No. PCT/SG2018/050343 dated Jan. 14, 2020 (6 pages).
(Continued)

*Primary Examiner* — Que Tan Le
*Assistant Examiner* — Don J Williams
(74) *Attorney, Agent, or Firm* — Michael Best & Friedrich LLP

(57) ABSTRACT

The present disclosure is directed to optoelectronic modules with substantially temperature-independent performance characteristics and host devices into which such optoelectronic modules can be integrated. In some instances, an optoelectronic module can collect proximity data using light-generating components and light-sensitive components that exhibit temperature-dependent performance characteristics. The light-generating components and light-sensitive components can be configured such that they exhibit complementing temperature-dependent performance characteristics such that the operating performance of the optoelectronic module is substantially temperature independent.

16 Claims, 1 Drawing Sheet

(51) Int. Cl.
    *H01L 31/12*   (2006.01)
    *H01S 5/068*   (2006.01)
    *H04R 3/00*    (2006.01)
    *G01K 7/02*    (2021.01)
    *G01K 7/22*    (2006.01)
    *H01S 5/183*   (2006.01)

(52) U.S. Cl.
    CPC .......... *H04R 3/00* (2013.01); *G01J 2001/444* (2013.01); *G01K 7/02* (2013.01); *G01K 7/22* (2013.01); *H01S 5/183* (2013.01)

(56) References Cited

U.S. PATENT DOCUMENTS

| | | |
|---|---|---|
| 2006/0221047 A1 | 10/2006 | Tanizoe et al. |
| 2012/0063121 A1 | 3/2012 | Atkins |
| 2014/0070078 A1 | 3/2014 | Land et al. |
| 2015/0115145 A1 | 4/2015 | Edwards |
| 2016/0056608 A1 | 2/2016 | Kim |

OTHER PUBLICATIONS

Extended Search Report issued from the European Patent Office for related Application No. 18832092.3 dated Mar. 4, 2021 (13 Pages).
Briggs et al., Fabrication, Packaging and Performance of VCSELs and Photodetectors for Space Applications, Optoelectronic Signal Processing for Phased-Array Antennas IV, vol. 3627, Apr. 29, 1999 p. 40, XP055776938, Retrieved from the Internet: URL: https://core. ac.u k/ download/ pdf/194740 216 . pdf> (9 Pages).
International Search Report for corresponding International Application No. PCT/SG2018/050343 dated Jul. 11, 2018.

\* cited by examiner

OPTOELECTRONIC MODULES WITH TEMPERATURE-INDEPENDENT CHARACTERISTICS

CROSS REFERENCE TO RELATED APPLICATIONS

This patent application is the U.S. national stage entry, under 35 U.S.C. § 371, of International Application No. PCT/SG2018/050343, filed Jul. 11, 2018, which claims priority to U.S. Provisional Patent Application No. 62/531,140 filed Jul. 11, 2017, the entire contents of which are hereby incorporated by reference.

BACKGROUND

An optoelectronic module operable to collect proximity data can include a light-generating component, such as a vertical-cavity surface-emitting laser (VCSEL) diode or a light-emitting diode (LED); and a light-sensitive component, such as a photodiode, operable to collect light emitted by the light source. The operating characteristics of both components, and therefore the overall performance of the optoelectronic module, can be temperature dependent.

For example, VCSELs can exhibit a cavity mode and/or a gain-peak shift with increasing temperature. A 980-nm VCSEL with InGaAs quantum wells, for example, can be characterized by a cavity mode shift of $0.07$ $nm° C.^{-1}$ and a gain-peak shift of $0.3$ $nm° C.^{-1}$. Consequently the performance of an optoelectronic module into which such a VCSEL is integrated can also be temperature dependent. Further, photodiodes can exhibit greater sensitivity to longer wavelengths of light at higher temperatures. Consequently, the performance of an optoelectronic module into which such a photodiode is integrated can also be temperature dependent. This temperature dependence can be compounded when both components exhibit temperature-dependent performance characteristics that do not counteract or otherwise complement each other.

Optoelectronic modules with temperature-dependent performance characteristics can present significant disadvantages when used to collect data, such as proximity data. For example, proximity data is often determined from variations in the intensity of the signals collected by the light-sensitive component. Temperature-dependent variations in the light-sensitive component and/or light-generating component that affect the intensity of the signals obscure those variations in intensity due to proximity. This effect can present significant challenges as optoelectronic modules are often intended to collect proximity data over a large range of operating temperatures (e.g., −5 to 45° C.).

State-of-the-art approaches for avoiding the deleterious effects of components that exhibit temperature-dependent performance characteristics can be cumbersome. In some instances, these approaches can be costly to implement, can result in less than optimal performance characteristics, and/or increase the module form factor. Therefore, approaches are needed that exhibit temperature-independent performance characteristics, or substantially temperature-independent performance characteristics where signals vary by a relatively insubstantial amount over a range of operating temperatures (e.g., 2% over an operating temperature range of between −5 and 45° C.), without the aforementioned limitations.

SUMMARY

The present disclosure is directed to discrete optoelectronic modules characterized by substantially temperature-independent performance characteristics, pluralities of such optoelectronic modules, and systems and devices into which such optoelectronic modules are integrated.

The extent of substantially temperature-independent performance characteristics can vary by the requirements of a particular application. For example, in some instances an application may require a change in performance characteristics of no more than 2% over an operating temperature range of −5 and 45° C. Other applications may require more or less stringent performance characteristics.

The optoelectronic modules of the present disclosure are operable to emit light from light generating components and generate signals from at least a portion of the emitted light (e.g., light emitted by and then at least partially reflected back to the optoelectronic modules) using light-sensitive components. Such optoelectronic modules can include proximity sensors, rangefinder cameras, and imagers operable to collect three-dimensional data (e.g., time-of-flight imagers, active-stereo imagers, and structured-light imagers). Such light-generating components can include any one of, or combinations of a vertical-cavity surface-emitting laser, another type of laser diode (e.g., an edge-emitting laser diode), a light-emitting diode, and/or an array including any of the aforementioned. Such light-sensitive components can include any one of, or combination of a photodiode, a charge-coupled device, a complementary metal-oxide semiconductor device, and/or an array including any of the aforementioned.

In some implementations, the optoelectronic modules include one or more light-generating components and one or more light-sensitive components having complementing temperature-dependent performance characteristics. These components are configured such that the optoelectronic modules exhibit substantially temperature-independent performance characteristics. In such implementations, these optoelectronic modules can be configured to collect data that is substantially invariant to changes in operating temperature. Moreover, means for determining the operating temperature and correcting the collected data or otherwise compensating for changes in the operating temperature may, in some instances, be excluded from these optoelectronic modules leading to improved performance, lower manufacturing costs, and/or smaller module form factor.

In some implementations, the optoelectronic modules include one or more optical components configured to complement the temperature-dependent performance characteristics of the light-generating and/or light-sensitive components. In such implementations, the optical components include a dielectric material with a particular thickness such as a dielectric optical filter. The thickness of the dielectric material can be configured to complement the temperature-dependent performance characteristics of the light-generating and/or light-sensitive components. In such implementations, the dielectric material may enable the optoelectronic modules to collect data that is substantially invariant to changes in operating temperature without a substantial increase in manufacturing costs and/or module form factor.

In some implementations, light-generating components can include one or more VCSELs. The VCSELs can be configured to complement the temperature-dependent performance characteristics of light-sensitive components. In such implementations, the VCSELs can be configured to exhibit both cavity mode and gain-peak shifts that complement the temperature-dependent performance characteristics of the light-sensitive components.

In other implementations, the optoelectronic modules can include other components for determining the operating temperature of the optoelectronic modules (e.g., thermistors, thermocouples) and/or may be operable to determine the operating temperature from the forward voltage of the light-generating component. In such implementations, the optoelectronic modules can be configured to use the operating temperature as input to alter the optical power of the light-generating components such that the temperature-dependent performance characteristics of the light-sensitive component are compensated, and/or to alter the sensitivity of the light-sensitive components such that the temperature-dependent performance characteristics of the light-generating components are compensated.

In other implementation, the optoelectronic modules can be integrated into host devices. The host devices may include processors and other electronic components, and other supplemental modules configured to collect data. The host devices may further include non-volatile memory where instructions for operating the optoelectronic modules are stored. The components and supplemental modules integrated into the host devices may generate significant heat, and may increase the operating temperature of the optoelectronic modules. The optoelectronic modules having substantially temperature-independent performance characteristics possess a significant advantage in such implementations. For example, the accuracy of data collected by these optoelectronics modules can be invariant with changes in operating temperature. This invariance can confer substantial advantages to the host devices into which these optoelectronic modules are implemented. For example, in some instances the optoelectronic modules are proximity sensors and are integrated into smartphones. Since the proximity data collected by these proximity sensors is invariant with operating temperature, and the proximity data is used for functions executed by the smartphones (e.g., screen response to user proximity), these functions can also be temperature invariant thereby conferring substantial advantages to the smartphone itself.

In some implementations, a host device, such as a smartphone includes a supplemental module, such as a display screen configured to respond to signals collected by the one or more proximity sensors. Signals collected by the one or more proximity sensors include signals corresponding to proximity data, and the response of the display screen includes altering the state of the display screen.

In some implementations, a host device, such as a smartphone includes a supplemental module, such as an audio device (e.g., a speaker and/or a microphone) configured to respond to signals collected by the one or more proximity sensors. Signals collected by the one or more proximity sensors include signals corresponding to proximity data, and the response of the audio device includes altering the volume and/or sensitivity of the audio device.

Other aspects, features, and advantages will be apparent from the following detailed description, the accompanying drawings, and the claims.

DETAILED DESCRIPTION

Figure 1B:
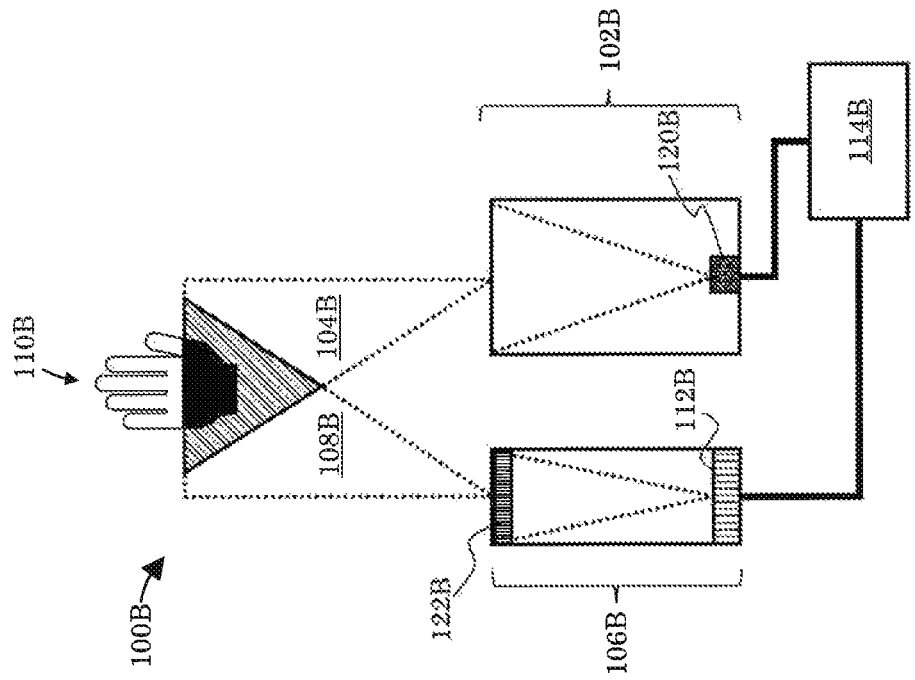
FIG. 1B depicts another example optoelectronic module with substantially temperature-independent characteristics.
Figure 1A:
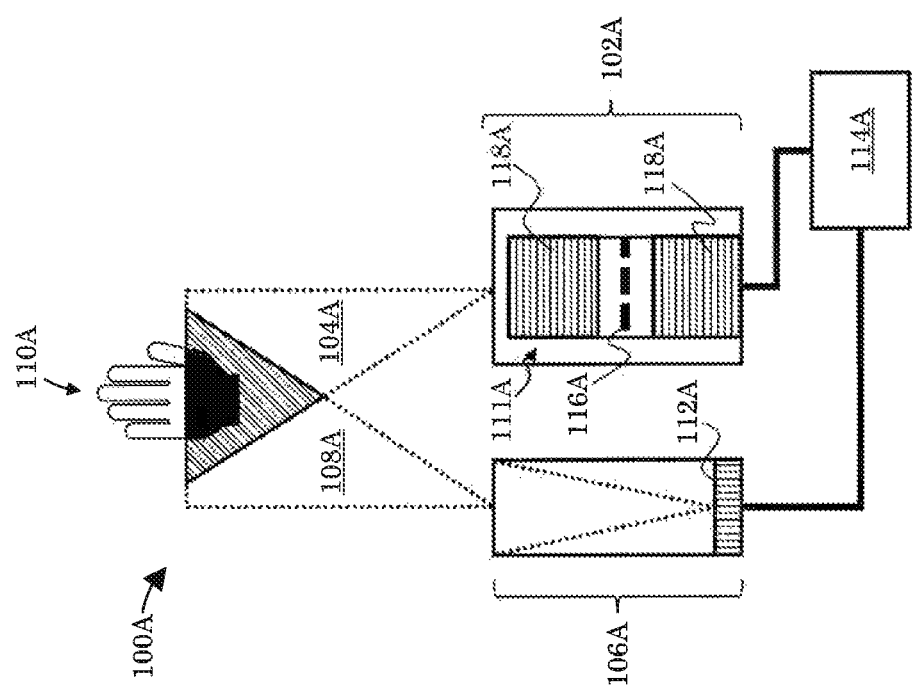
FIG. 1A depicts an example optoelectronic module with substantially temperature-independent characteristics.

FIG. 1A depicts an example optoelectronic module 100A with substantially temperature-independent characteristics. The example optoelectronic module 100A can be operable to collect proximity data and includes a light-generating component 102A operable to generate light 104A and a light-sensitive component 106A operable to collect light 108A reflected from an object 110A.

The light-generating component 102A can include a vertical-cavity surface-emitting laser (VCSEL) 111A as depicted in FIG. 1A, another laser diode, a light-emitting diodes (LED), or a plurality of VCSELs, other laser diodes, LEDs, or any combination thereof. The VCSEL 111A can include a gain material 116A, and a plurality of distributed Bragg reflectors (DBR) 118A wherein the DBR include a plurality of layers each being characterized by a refractive index and a layer thickness. The light-generating component 102A can include other components necessary for the function of the VCSEL 111A, such as power sources and other electrical components, such as contacts, conduits, resistors, transistors and so forth. In some instances, the light-generating component 102A can include optical components, such as optical assemblies including one or more optical elements and/or optical filters (e.g., spectral filters).

The light-sensitive component 106A can include a photodiode 112A as depicted in FIG. 1A, or an array of photodiodes, charge-coupled devices, complementary metal-oxide semiconductor devices, or any combination thereof. The light-sensitive component 106A is further operable to convert light 108A into signals. In some instances, as depicted in FIG. 1A, the light-sensitive component 106A is communicatively coupled to a processor 114A, wherein proximity of the object 110A can be determined from the intensity of signals. The light-sensitive component 106A can include other components necessary for the function of the photodiode 112A and the processor 114A such as power sources and other electrical components such as contacts, conduits, resistors, transistors, and so forth.

In some implementations, the photodiode 112A is characterized by a spectral response shift to longer wavelengths with increasing temperature; that is, the responsivity or sensitivity to longer wavelengths increases with increasing temperature in this example. Therefore, the light-sensitive component 106A exhibits temperature-dependent performance characteristics.

Further, in some implementations, the light-generating component 102A can exhibit temperature-dependent performance characteristics. For example, the VCSEL 111A, with increasing temperature can exhibit laser gain shifts to longer wavelengths faster than cavity resonance shifts to longer wavelengths. Consequently, spectral misalignment between the cavity resonance and peak gain can occur causing a reduction in the VCSEL 111A performance with increasing operating temperature (e.g., higher threshold currents and/or reduced light output power with increasing operating temperature). The VCSEL 111A can be configured, however, to complement the temperature-dependent performance characteristics of the light-sensitive component 106A. That is, in some implementations, the temperature-dependent performance characteristics of the VCSEL 111A can be configured to complement the changes in responsivity with temperature exhibited by the light-sensitive component 106A.

For example, the VCSEL 111A, as depicted in FIG. 1A, is configured such that the peak laser gain shifts out of alignment with the cavity resonance to yield poorer VCSEL performance at higher temperatures according to the increase in responsivity of the light-sensitive component 106A at higher temperatures. The optoelectronic module 100A, therefore, can exhibit substantially temperature-independent performance characteristics. In some instances, the refractive index and/or thickness of the DBR layers, and/or the number of DBR layers can be configured such that the VCSEL exhibits the spectral misalignment as described above thereby resulting in substantially temperature-independent performance characteristics of the optoelectronic module 100A. In some instances, substantially temperature-independent performance is characterized by a change in performance characteristics of no more than 2% over an operating temperature range of −5 and 45° C. In some instances, the change in performance in the signals collected by the light-sensitive component 106A with temperature is no more than 2% over an operating temperature range of −5 and 45° C. However, the percentage in signal variation with temperature varies with application, desired accuracy, precision, and so forth as required by a particular application.

FIG. 1B depicts another example optoelectronic module 100B with substantially temperature-independent characteristics. As above, the example optoelectronic module 100B can be operable to collect proximity data and includes a light-generating component 102B operable to generate light 104B and a light-sensitive component 106B operable to collect light 108B reflected from an object 110B.

The light-generating component 102B can include a light-emitting diode (LED) 120B as depicted in FIG. 1B, a VCSEL or other laser diode, or a plurality of VCSELs, other laser diodes, LEDs, or any combination thereof. The light-generating component 102B can include other components necessary for the function of the LED 120B such as power sources and other electrical components such as contacts, conduits, resistors, transistors and so forth. In some instances, the light-generating component 102B can include optical components, such as optical assemblies including one or more optical elements and/or optical filters (e.g., spectral filters).

The light-sensitive component 106B can include a photodiode 112B as depicted in FIG. 1B, or an array of photodiodes, charge-coupled devices, complementary metal-oxide semiconductor devices, or any combination thereof. The light-sensitive component 106B is further operable to convert light 108B into signals. In some instances, as depicted in FIG. 1B, the light-sensitive component 106B is communicatively coupled to a processor 114B, wherein proximity of the object 110B can be determined from the intensity of signals. The light-sensitive component 106B can include other components necessary for the function of the photodiode 112B and the processor 114B such as power sources and other electrical components such as contacts, conduits, resistors, transistors, and so forth.

In some implementations, the photodiode 112B is characterized by a spectral response shift to longer wavelengths with increasing temperature (i.e., the responsivity or sensitivity to longer wavelengths increases with increasing temperature); therefore, the light-sensitive component 106B exhibits a temperature-dependent performance characteristics. Further, in some implementations, the light-generating component 102B can exhibit temperature-dependent performance characteristics; for example, the light 104B generated by the light-generating component 102B can shift to longer wavelengths with higher temperatures. These two temperature-dependent performance characteristics are compounding; that is, both can cause changes in signal intensity irrespective of object proximity.

Consequently, since the light 104B generated by the light-generating component 102B shifts to longer wavelengths at higher temperatures, and the photodiode's 112B sensitivity to longer wavelengths increases with temperature, the light-sensitive component 106B further includes an optical component 122B (e.g., a dielectric filter) configured to be non-transmissive (e.g., configured to attenuate) longer wavelengths of light according to the two temperature-dependent performance characteristics described above. In some instances, the thickness of the optical component 122B can be customized to complement the temperature dependent characteristics of the light-generating component 102B and the light-sensitive component 106B.

The optoelectronic module 100B, therefore, can exhibit substantially temperature-independent performance. In some instances, substantially temperature-independent performance is characterized by a less than 1% variation in the signals collected by the light-sensitive component 106B with temperature. However, the percentage in signal variation with temperature varies with application, desired accuracy, precision, and so forth.

In some implementations, an example optoelectronic module, such as those depicted in FIG. 1A or FIG. 1B can exhibit substantially temperature-independent performance characteristics via an active feedback loop that is an alternative to, or is an addition to, the approaches described above. For example, the light output power generated by a light-generating component can be configured to decrease with temperature at a similar rate as a light-sensitive component responsivity increases with temperature.

In some instances, the operating temperature (i.e., the temperature of the photodiode 112A or 112B as depicted in FIG. 1A, FIG. 1B, respectively) can be measured by a thermistor. In some instances, the operating temperature can be inferred by reading the forward voltage of a component within the light-generating component, such as the VCSEL 111A. In such instances, the operating temperature can be used to determine the optimum electrical power to be distributed to the light-generating component (e.g., the VCSEL 111A, or the LED 120B) such that the performance of the optoelectronic module is substantially temperature independent.

Still in other instances, where the light-generating component includes a VCSEL, such as VCSEL 111A, the junction temperature (i.e., within the gain material 116A) can be increased by increasing injection currents into the gain material. The increase in junction temperature can induce a change in VCSEL performance that compliments the temperature dependent performance characteristics of the light-sensitive component, such as the light sensitive component 106A as depicted in FIG. 1A.

The optoelectronic modules as depicted in FIG. 1A and FIG. 1B can be integrated into host devices such as smartphones, laptops, wearable devices, other computers, and automobiles. The host devices may include processors and other electronic components, and other supplemental modules configured to collect data, such as cameras, time-of-flight imagers. Other supplemental modules may be included such as ambient lighting, display screens, automotive headlamps, and the like. The host devices may further include non-volatile memory where instructions for operating the optoelectronic modules, and in some instances the supplemental modules, are stored. The components and supplemental modules integrated into the host devices may generate significant heat, and may increase the operating temperature of the optoelectronic modules. The optoelectronic modules having substantially temperature-independent performance characteristics possess a significant advantage in such implementations. For example, the accuracy of data collected by these optoelectronics modules can be invariant with changes in operating temperature. This invariance can confer substantial advantages to the host devices into which these optoelectronic modules are implemented. For example, in some instances the optoelectronic modules are proximity sensors and are integrated into smartphones. Since the proximity data collected by these proximity sensors is invariant with operating temperature, and the proximity data is used for functions executed by the smartphones (e.g., screen response to user proximity), these functions can also be temperature invariant thereby conferring substantial advantages to the smartphone itself.

In some instances, a host device such as a smartphone can include a supplemental module, such as a display screen configured to respond to signals collected by the one or more proximity sensors. Signals collected by the one or more proximity sensors include signals corresponding to proximity data, and the response of the display screen includes altering the state of the display screen.

In some instances, a host device such as a smartphone can include a supplemental module, such as an audio device (e.g., a speaker and/or a microphone) configured to respond to signals collected by the one or more proximity sensors. Signals collected by the one or more proximity sensors include signals corresponding to proximity data, and the response of the audio device includes altering the volume and/or sensitivity of the audio device.

Other modifications may be made to the foregoing implementations, and features described above in different implementations may be combined in the same implementation. Thus, other implementations are within the scope of the claims.

The invention claimed is:

1. An optoelectronic module operable to collect signals and being characterized by substantially temperature-independent performance characteristics, the module comprising:
   a light-generating component operable to emit light, wherein the light-generating component exhibits temperature-dependent performance characteristics; and
   a light-sensitive component operable to collect at least a portion of the light emitted by the light-generating component, wherein the light-sensitive component exhibits temperature-dependent performance characteristics;
   wherein the temperature-dependent performance characteristics of the light-generating component and the temperature-dependent performance characteristics of the light-sensitive component complement each other such that the optoelectronic module exhibits substantially temperature-independent performance characteristics.

2. The optoelectronic module of claim 1, wherein the light-sensitive component includes an optical component configured to complement the temperature-dependent performance characteristics of the light-generating component.

3. The optoelectronic module of claim 2, wherein the optical component includes a dielectric material characterized by a thickness, wherein the thickness of the dielectric material is configured to complement the temperature-dependent performance characteristics of the light-generating component such that the optoelectronic module exhibits substantially temperature-independent performance characteristics.

4. The optoelectronic module of claim 1, wherein the light-generating component includes a vertical-cavity surface-emitting laser.

5. The optoelectronic module of claim 4, wherein the vertical-cavity surface-emitting laser is characterized by the temperature-dependent performance characteristics of the light-generating component, wherein the vertical-cavity surface emitting laser is configured to exhibit the temperature-dependent performance characteristics that complement the temperature-dependent performance characteristics of the light-sensitive component such that the optoelectronic module exhibits substantially temperature-independent performance characteristics.

6. The optoelectronic module of claim 5, wherein the vertical-cavity surface-emitting laser is configured to exhibit a cavity mode shift and peak gain shift that complements the temperature-dependent performance characteristics of the light-sensitive component.

7. The optoelectronic module of claim 1, wherein the light-generating component is characterized by an optical power that varies with the temperature-dependent performance characteristics of the light-sensitive component such that the optoelectronic module exhibit substantially temperature-independent performance characteristics.

8. The optoelectronic module of claim 7, further comprising a thermistor or a thermocouple.

9. The optoelectronic module of claim 8, wherein the thermistor or thermocouple is mounted adjacent to the light-sensitive component.

10. The optoelectronic module of claim 1, further comprising a processor communicatively coupled to the light-sensitive component.

11. The optoelectronic module of claim 1, wherein the light-sensitive component is any of: a photodiode, an array of charge-coupled devices, and/or an array of complementary metal-oxide semiconductor devices.

12. The optoelectronic module of claim 1, wherein the light-generating component is any of: a vertical-cavity surface-emitting laser, another type of laser diode, and/or a light-emitting diode.

13. A host device including one or more optoelectronic modules as in claim 1 to collect signals and being characterized by substantially temperature-independent performance characteristics, the host device comprising a supplemental module configured to respond to signals collected by the one or more optoelectronic modules.

14. The host device of claim 13, wherein the one or more optoelectronic modules includes a proximity sensor, the supplemental module includes a display screen, the signals collected by the proximity sensor includes signals corresponding to proximity data, and the response of the display screen includes altering the state of the display screen.

15. The host device of claim 13, wherein the one or more optoelectronic modules includes a proximity sensor, the supplemental module includes an audio device, the signals collected by the proximity sensor includes signals corresponding to proximity data, and the response of the audio device includes altering the volume and/or sensitive of the audio device.

16. The host device of claim 15, wherein the audio device incudes a speaker and/or a microphone.

* * * * *